Aug. 6, 1963 O. L. MEYER 3,100,276

SEMICONDUCTOR SOLID CIRCUITS iled April 18, 1960 2 Sheets-Sheet 1

INVENTOR

OWEN L. MEYER

BY S. J. Rotondi, A. J. Dupont, F. E. McGee & J. P. Edgerton

SEMICONDUCTOR SOLID CIRCUITS

Filed April 18, 1960 2 Sheets-Sheet 2

INVENTOR

OWEN L. MEYER

BY S. J. Rotondi, A. J. Dupont, J. E. McGee & J. P. Edgerton

United States Patent Office 3,100,276
Patented Aug. 6, 1963

3,100,276

SEMICONDUCTOR SOLID CIRCUITS

Owen L. Meyer, Washington, D.C., assignor to the United States of America as represented by the Secretary of the Army Filed Apr. 18, 1960, Ser. No. 23,106
1 Claim. (Cl. 317—234)
(Granted under Title 35, U.S. Code (1952), sec. 266)

The invention described herein may be manufactured and used by or for the Government for governmental purposes without the payment to me of any royalty thereon.

This invention relates generally to the microminiaturization of electronic circuitry, and more particularly to a body of semiconductive material which is modified so that any circuit component can be incorporated therewith for use in an electronic circuit.

Electronic circuits and components are often used in applications in which available space is at a premium. In these applications the size of each component becomes critical, and the problem of miniaturizing each component therefore arises. The development of the transistor and of printed circuit techniques have contributed to the solution of this problem. However, those working in the miniaturization field have long recognized the need for a highly miniaturized solid circuit utilizing a body of semiconductive material both as the support for and as a component of such a circuit.

One of the formidable obstacles in the path of the development of such a solid circuit has been the undesired electrical coupling which occurs between elements mounted on the same semiconductive body. This invention effects a solution to this hitherto unsolved problem by mounting components on the outermost layer of a double diffused semiconductor and surrounding each component by a groove which extends into the semiconductor body a distance sufficient to provide effective electrical isolation of said components.

Accordingly, it is broadly an object of this invention to provide a solid circuit which is highly miniaturized and simply fabricated by well known transistor techniques.

A further and more specific object of this invention is to provide a plurality of electronic components integral with a body of semiconductor material such that undesired electrical coupling between said components is avoided.

The specific nature of the invention, as well as other objects, uses and advantages thereof, will clearly appear from the following description and from the drawing, in which.

Figure 1:
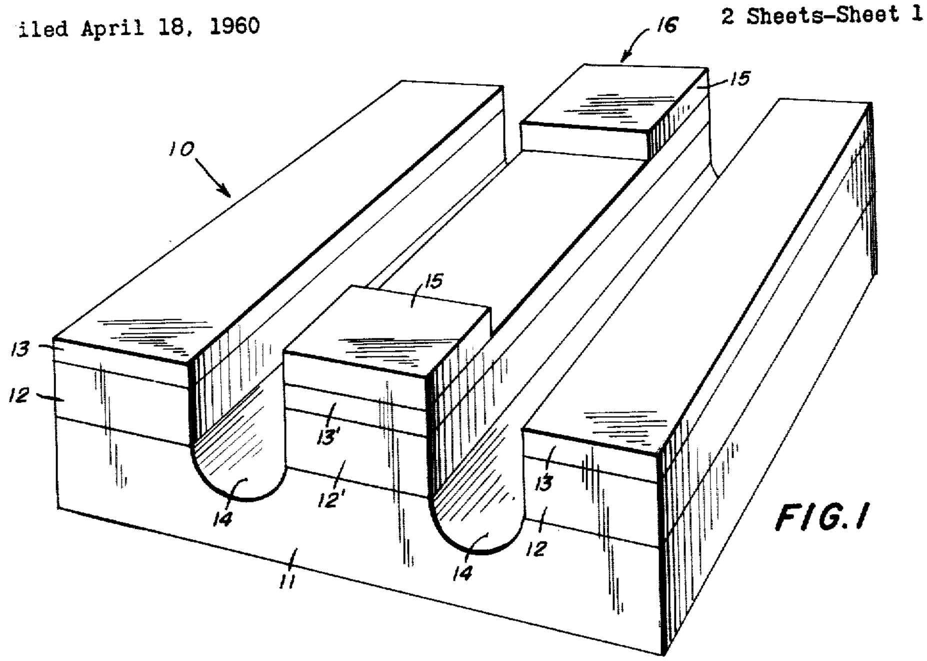
FIG. 1 represents a perspective view of a resistor incorporated in a solid circuit in accordance with this invention.

Referring now to FIG. 1, there is shown a block-shaped semiconductor body 10 of germanium or silicon, for example, comprising three semiconductor layers 11, 12 and 13 of alternating conductivity types; that is, layers 11, 12 and 13 are, respectively, either P, N and P types or N, P and N types. Layers 12 and 13 are applied to the substrate layer 11 by well known diffusion techniques or by any other suitable method. For example, the entire semiconductor body 10 could be grown by conventional methods. If diffusion techniques were employed, the middle layer 12 would first be diffused into substrate layer 11 and thereafter the outer layer 13 diffused into layer 12. Although the semiconductor is shown as block-shaped, it could, for example, be cylindrical.

Grooves 14, extending into the substrate layer 11, isolate a portion 13' of outer layer 13 and a portion 12' of middle layer 12. The grooves 14 are formed by etching processes or, in the case where semiconductor 10 is cylindrically shaped, by well known machining techniques. Contacts 15 are evaporated onto portion 13' at either end thereof. The structure defined by contacts 15 and portion 13' comprises a resistor 16 whose value of resistance depends upon the geometry of portion 13' and the doping of the top layer 13. If the doping is high, the resistance will remain substantially constant over the normal range of operating temperatures.

As shown in FIG. 1, resistor 16 is isolated from the substrate layer 11 by back-to-back PN junctions (or a transistor with its base floating) as long as portion 12' is electrically unconnected. Therefore, resistor 16 will be isolated from any other element which may be formed on layer 13. The current coupling the resistor to any other element is limited by the reverse characteristic of either PN junction, depending upon which is forward and which is reverse biased.

Figure 6:
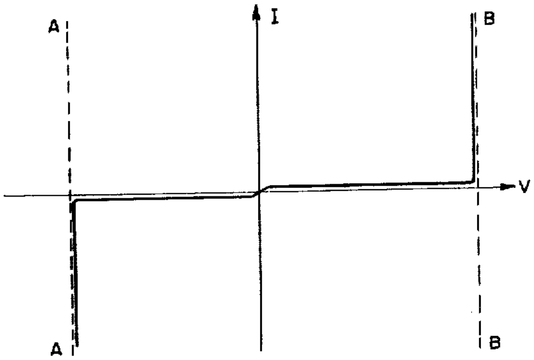
FIG. 6 shows the current characteristic of a transistor with its base floating or of back-to-back PN junctions.

This can best be seen from the current characteristic illustrated by the graph of FIG. 6. As long as the voltage on resistor 16 relative to that of substrate layer 11 is less than the breakdown voltage of either junction represented by dotted lines A—A and B—B, portion 12' will float. Consequently, most of the voltage will appear across the reverse biased junction, due to its high impedance, and the drop across the forward biased junction will be small. The steady state injected forward current is equal to the reverse saturation current, which is negligible in practical circuit applications. Of course, care must be exercised to insure that neither junction breakdown voltage is exceeded. However, this is largely an academic problem since the usual range of operating voltages lies well within the limits (approximately minus 20 v. to plus 50 v.) defined by dotted lines A—A and B—B.

Figure 2:
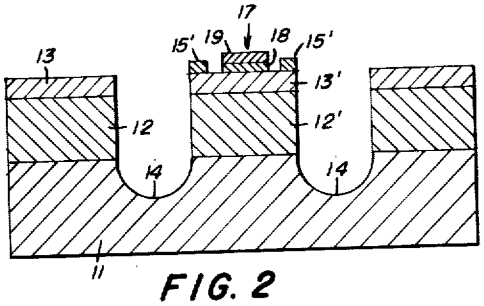
FIGS. 2, 3 and 4 represent cross-sectional side views of a solid circuit incorporating, respectively, a capacitor, a diode and a transistor.

In FIG. 2, capacitor 17 is formed by depositing a dielectric 18, which could be an oxide of the semiconductor or of titanium, for example, upon portion 13' which serves as one plate of the capacitor. The other plate is formed by depositing a conducting layer 19 upon the dielectric. Contact 15' is provided as in FIG. 1.

Figure 3:
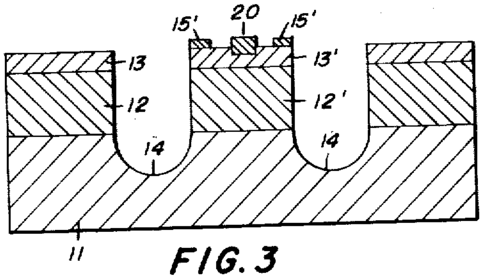

In FIG. 3, the diode is formed by alloying or diffusing an emitter 20 into the outermost layer. The resulting PN junction is isolated from the substrate layer 11 by two other junctions in series as explained above.

It should be realized that in the examples of FIGS. 1, 2 and 3, connections could be made to the substrate layer 11 as long as portion 12' is left floating. In this way a plurality of transistors could be constructed utilizing similarly isolated portions of layer 13 as emitters, isolated portions of layer 12 as bases, and the substrate layer 11 as a common collector. The necessary contacts would, of course, be affixed to the emitters and bases. Isolation between the resistor, capacitor or diode and any of the thusly constructed transistors would still be effectuated since the current characteristic of FIG. 6 would apply as long as portion 12' floats.

Figure 4:
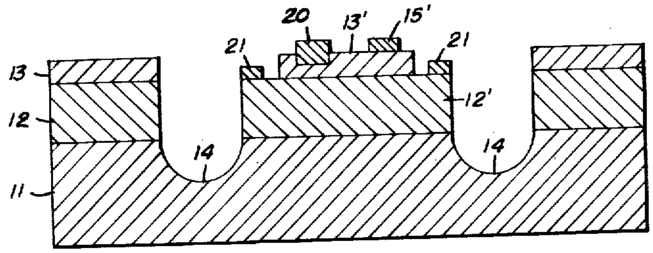

In FIG. 4, part of portion 13' has been cut or etched away so that contacts 21 may be applied to portion 12' which serves as the collector of the diffused base transistor. Contact 15' is affixed to portion 13' which serves as the base. As in the embodiment of FIG. 4, emitter 20 is either alloyed or diffused into the outside portion 13'. Of course, in this embodiment, substrate layer 11 must be left floating since connections are made to portion 12'. The collector of the diffused-base transistor will thereby be isolated from the collector of any other transistor constructed in the same manner, by a PNP (or NPN) structure with a floating base. The collector of the diffused-base transistor will likewise be isolated from any other component affixed to the layer 13.

In FIGS. 2, 3 and 4, contact 15 could either be a single bar or a contact extending completely around the periphery of its associated semiconductor portion. The peripheral type of contact is perferable, since it lowers contact resistance for any given layer.

While the isolation of single circuit components have been illustrated, it should be realized that the principle could be extended to an entire circuit if isolation among the components thereof were not required. It should further be apparent that the components illustrated could be combined in any desired manner on a single semiconductor body in order to form a particular circuit as long as back-to-back PN junctions are maintained between all components to be isolated.

Figure 5:
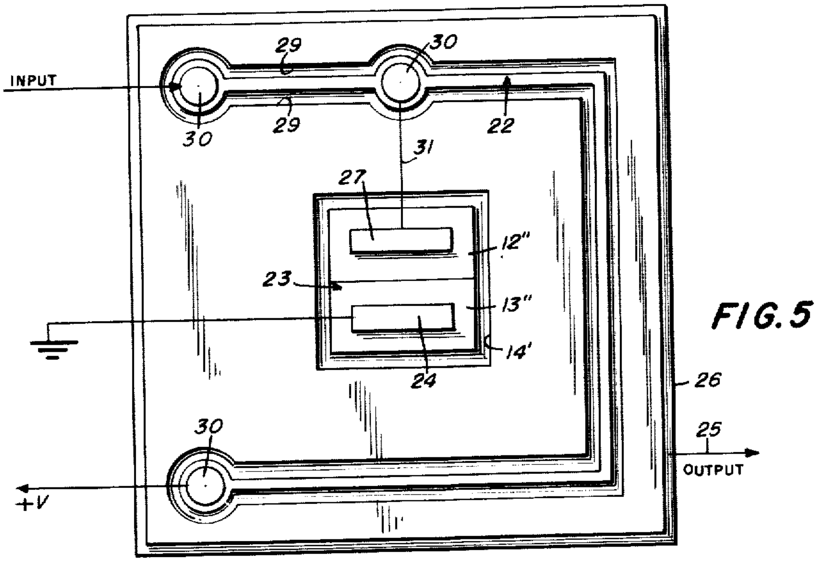
FIG. 5 represents an electronic circuit constructed in accordance with this invention.
Figure 5A:
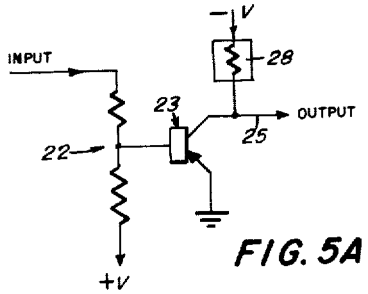
FIG. 5A is a schematic diagram of the circuit of FIG. 5.

FIGS. 5 and 5A show an inverter circuit constructed in accordance with this invention. A three-layer semiconductor body, as described in connection with FIGS. 1–4, is provided with a resistor 22, having contacts 30 affixed thereto, and a transistor 23. Grooves 29 and 14' extending into the semiconductor body provide effective isolation between the resistor and transistor, as previously described. The transistor utilizes the three layers 11, 12'' and 13'', respectively, as the collector, base and emitter thereof. A connection is made from the base contact 27 to a point on resistor 22 such that it is divided into two resistances, one having a value of approximately five times the other. An output connection 25 is taken from collector contact plate 26 which is soldered to substrate layer 11. The emitter contact 24 is grounded and contact 26 is adapted to be plugged into a common load 28 which is connected to a negative potential along with other similar inverter circuits. An input connection is made to one end of resistor 22, while the other end thereof is maintained at a positive potential. As is well known, if the input to the circuit is zero, there will be a negative output, while if the input is sufficiently negative, the output will be zero, thus achieving the inverter function. Although the circuit described is relatively simple, it should now be apparent that more complex circuits could be constructed on a single semiconductor body in accordance with this invention.

It will be apparent that the embodiments shown are only exemplary and that various modifications can be made in construction and arrangement within the scope of the invention as defined in the appended claim.

I claim as my invention:

A solid circuit comprising a continuous semiconductor substrate layer of a first conductivity type, an inner semiconductor layer of a second conductivity type on said substrate layer, an outer semiconductor layer of said first conductivity type on said inner layer, a plurality of grooves originating in said outer layer arranged so that said grooves isolate a discrete portion of said outer layer, said grooves extending into and terminating within said substrate layer and electrical contact means affixed to said discrete portion for utilizing said discrete portion as a circuit component in said solid circuit.

References Cited in the file of this patent

UNITED STATES PATENTS

| | | |
|---|---|---|
| 2,846,592 | Ritz | Aug. 5, 1958 |
| 2,925,501 | Weese et al. | Feb. 16, 1960 |
| 2,967,952 | Shockley | Jan. 10, 1961 |
| 2,969,497 | Kiyasu et al. | Jan. 24, 1961 |
| 2,974,236 | Pankove | Mar. 7, 1961 |
| 2,998,550 | Collins et al. | Aug. 29, 1961 |
| 3,005,937 | Wallmark et al. | Oct. 24, 1961 |
| 3,015,763 | Bailey | Jan. 2, 1962 |
| 3,029,366 | Lehovec | Apr. 10, 1962 |

UNITED STATES PATENT OFFICE

CERTIFICATE OF CORRECTION

Patent No. 3,100,276 Agust 6, 1963

Owen L. Meyer

It is hereby certified that error appears in the above numbered patent requiring correction and that the said Letters Patent should read as corrected below.

In the sheets of drawings and in the heading to the printed specification, title of invention, for "SEMICONDUCTORS SOLID CIRCUITS" read -- SEMICONDUCTOR INTEGRATED CIRCUITS --; column 1, lines 26, 30, 40, 54 and 57, and column 4, lines 16 and 26, for "solid circuit" read -- semiconductor integrated circuit --.

Signed and sealed this 11th day of February 1964.

(SEAL)
Attest:
ERNEST W. SWIDER

Attesting Officer

EDWIN L. REYNOLDS

Acting Commissioner of Patents